(12) United States Patent
Lee

(10) Patent No.: US 7,545,480 B2
(45) Date of Patent: Jun. 9, 2009

(54) RETICLE, EXPOSURE APPARATUS, AND METHODS FOR MEASURING THE ALIGNMENT STATE THEREOF

(75) Inventor: Byeong-Cheol Lee, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 526 days.

(21) Appl. No.: 11/267,053

(22) Filed: Nov. 3, 2005

(65) Prior Publication Data

US 2006/0109441 A1  May 25, 2006

(30) Foreign Application Priority Data

Nov. 3, 2004  (KR) ............... 10-2004-0089018

(51) Int. Cl.
*G03B 27/42* (2006.01)
*G03B 27/58* (2006.01)
*G01B 11/00* (2006.01)
*G03B 27/62* (2006.01)

(52) U.S. Cl. .................. 355/53; 355/72; 355/75; 356/401

(58) Field of Classification Search .............. 355/53, 355/55, 72, 75; 356/399, 400, 401
See application file for complete search history.

(56) References Cited

U.S. PATENT DOCUMENTS

| 6,269,322 B1 | 7/2001 | Templeton et al. |
| 2002/0041368 A1* | 4/2002 | Ota et al. .................... 355/55 |

FOREIGN PATENT DOCUMENTS

| KR | 1998-21238 | 6/1998 |
| KR | 2000-0001960 | 1/2000 |
| KR | 2000-51889 | 8/2000 |

OTHER PUBLICATIONS

English language abstract of Korean Publication No. 1998-21238.
English language abstract of Korean Publication No. 2000-51889.

* cited by examiner

*Primary Examiner*—Peter B Kim
(74) *Attorney, Agent, or Firm*—Marger Johnson & McCollom, P.C.

(57) ABSTRACT

A reticle and an exposure apparatus using the reticle are provided. The reticle includes alignment marks having a plurality of segments along coordinate directions corresponding to a plurality of regions of the reticle, in symmetrical positions about coordinate axes. The reticle also includes detection sensors having detection regions corresponding to a mirror image of the alignment marks of the reticle. Accordingly, it is possible to prevent alignment errors generated due to aberration of a lens from being different on different sides of each coordinate axis, thus enabling more precise reticle alignment and therefore overlay alignment.

11 Claims, 10 Drawing Sheets

RETICLE, EXPOSURE APPARATUS, AND METHODS FOR MEASURING THE ALIGNMENT STATE THEREOF

CROSS-REFERENCES TO RELATED APPLICATIONS

This U.S. non-provisional patent application claims priority under 35 U.S.C. §119 of Korean Patent Application 2004-0089018 filed on Nov. 3, 2004, the entire contents of which are hereby incorporated by reference.

BACKGROUND OF THE INVENTION

1. Field of the Invention

The present invention relates to a reticle and an exposure apparatus using the reticle, and more particularly, to the use of such items with particularized alignment marks formed thereon to detect and adjust the alignment state thereof.

2. Description of the Prior Art

Generally, an exposure apparatus is used in a photolithography process for manufacturing a semiconductor device. The exposure apparatus functions to form a circuit pattern on a wafer by projecting the circuit pattern onto a target region of a wafer coated with a photosensitive material (photoresist) layer through a reticle (also referred to as a "mask"), thereby imaging the pattern of the reticle on the wafer.

Conventional semiconductor manufacturing forms a plurality of semiconductor chips next to one another on a wafer, with each chip typically corresponding to a particular target region. The pattern of the reticle is repeatedly imaged on each target region one by one.

Generally, the exposure apparatus can be divided into stepper-type apparatus and scanner-type apparatus. The stepper functions to form an entire pattern on a target region by exposing the target region once, while the scanner (or step-and-scan apparatus) functions to expose a target region by gradually scanning the reticle pattern in any one scanning direction and driving a wafer stage in the same or opposite direction.

Modern semiconductor devices are formed with a plurality of pattern layers, with each layer formed using similar procedures as described above. As feature sizes of the circuits formed on the wafers shrink, however, proper alignment of the multiple patterns becomes more difficult. Current techniques form a single microscopic alignment mark on the reticle and use that to track proper alignment during multiple exposures in the same target region.

Alignment using the scanner-type exposure apparatus has been found to be even more difficult since the high-powered KrF or ArF excimer laser light sources used during lithography heat the lens used to focus the light. Such heated lenses exhibit changed localized indices of refraction and other unpredictable optical aberrations. Such aberrations pose very serious problems, affecting overlay alignment when manufacturing a nano-scaled semiconductor device requiring an overlay margin of no more than 15 nm.

Overlay errors due to aberration generated at this time are classified into field translation, field rotation, field magnification, and third order distortion, as shown in FIGS. 1A, 1B, 1C, and 1D, respectively. While the field translation, the field rotation, and the field magnification can be relatively easily controlled by the conventional optical systems, the third order distortion, which is a mixed form of pincushion distortion and barrel distortion, cannot be easily controlled.

The third order distortion may be somewhat controlled by measuring X and Y coordinates between the reticle and the wafer stage (or the wafer). Current methods form a plurality of alignment marks at the reticle, install a detection sensor at the wafer stage to measure coordinates, and perform alignment thereby.

One drawback to this method, however, is that third order distortions increase the alignment error differential as the X and Y coordinates become even more asymmetrical with respect to a center of measured positions. This increasing alignment error caused by third order distortion can be seen from the following Formulae 1 in which error values corresponding to X and Y-axes are given by third order polynomial functions.

$$\text{X-axis error} = AX^3 + BX^2 + C, \text{Y-axis error} = A'Y^3 + B'Y^2 + C' \quad (1)$$

The above formulae show that when two coaxial alignment marks, located opposite to each other, are located at different positions about a center of measured positions, the larger the third order distortion constant A or A', the larger the difference between alignment errors.

Describing an example of alignment errors, the X-axis alignment mark having a plurality of segments formed in the X-axis direction and the Y-axis alignment mark having a plurality of segments formed in the Y-axis direction are horizontally aligned to be formed one by one in the same shape in all quadrants of the reticle, thereby allowing their alignment state to be measured. That is, in all quadrants, the Y-axis alignment mark is formed at a left side, and the X-axis alignment mark is formed at a right side, of the Y-axis alignment mark.

Here, the alignment state in the Y-axis direction has no alignment error since each segment is located at the same distance from the Y-coordinate axis of the reticle. However, the X-axis alignment mark has an alignment error since the segments are located at different distances from the X-coordinate axis. Moreover, the larger constant values of third order distortion become (A1<A2<A3), as shown in Formulae 1, the larger alignment error becomes as shown in FIGS. 2A and 2B.

In other words, when an X coordinate is located at a distance of 8.9 mm to the right of an optical axis on a wafer surface and another X coordinate is located at a distance of 12.9 mm to the left of the optical axis, error of the left alignment mark is about 0.2 μm in the case of the constant A1 of the third order distortion, about 0.38 μm in the case of the constant A2, and about 0.6 μm in the case of the constant A3. Meanwhile, error of the right alignment mark is about 0.08 μm in the case of A1, about 0.13 μm in the case of A2, and about 0.24 μm in the case of A3. In other words, the errors are not symmetric about the X-axis.

Finally, as shown in FIG. 2B, the alignment errors about a center (or the optical axis) of the reticle become gradually larger with an increasing distance from the X-axis. Therefore, in order to solve the problems of the conventional art, the present invention provides a reticle and an exposure apparatus using the reticle.

Accordingly, the need remains for methods that assist in overcoming errors, especially asymmetric errors, in alignment caused by third order distortions.

SUMMARY OF THE INVENTION

Therefore, to solve the problem described hereinabove, an object of the present invention is to provide a reticle for an exposure apparatus having alignment marks formed at a plurality of regions of the reticle and having a plurality of segments corresponding to coordinate directions at positions symmetrical about coordinate axes, thereby enabling precise measurement of coordinates regarding alignment error.

Another object of the present invention is to provide an exposure apparatus including a detection sensor having a plurality of detection segments for detecting a mirror image of alignment marks projected at positions symmetrical to each other with respect to a measurement center of the reticle.

Still another object of the present invention is to provide a method of measuring an alignment state of a reticle using an exposure apparatus including a transmission image sensor having a plurality of detection segments for detecting a mirror image of alignment marks formed at positions symmetrical to each other with respect to a measurement center.

In one aspect, the invention is directed to a reticle including: a substrate having a designed circuit pattern formed thereon; X-axis alignment marks formed at two or more positions on the substrate symmetrical about an X-axis and having a plurality of segments; and Y-axis alignment marks formed at two or more positions of the substrate symmetrical about a Y-axis and having a plurality of segments, whereby it is possible to allow each alignment mask to be positioned at the same distance from a center of the reticle to prevent generation of a detection error of the alignment mark due to asymmetry.

In one embodiment, the X- and Y-axis alignment marks may be located at the same distance from a center of the substrate.

In addition, the X-axis alignment mark may include a first X-axis alignment mark located at a first quadrant, a second X-axis alignment mark located at a second quadrant, a third X-axis alignment mark located at a third quadrant, and a fourth X-axis alignment mark located at a fourth quadrant, on a coordinate plane of the substrate.

In one embodiment, the first, second, third, and fourth X-axis alignment marks may be formed at the same distance from a coordinate center.

In addition, the Y-axis alignment mark may include a first Y-axis alignment mark located at a first quadrant, a second Y-axis alignment mark located at a second quadrant, a third Y-axis alignment mark located at a third quadrant, and a fourth Y-axis alignment mark located at a fourth quadrant, on a coordinate plane of the substrate.

In one embodiment, the first, second, third, and fourth Y-axis alignment marks may be formed at the same distance from the coordinate center.

In another aspect, the invention is directed to an exposure apparatus including: a light source; a reticle, through which light radiated from the light source is transmitted, having a designed pattern formed thereon and having X-axis alignment marks and Y-axis alignment marks, the X-axis alignment marks having a plurality of segments formed at two or more positions on a substrate symmetrical about and equidistant from an X-axis, the Y-axis alignment marks having a plurality of segments formed at two or more positions of the substrate symmetrical about and equidistant from a Y-axis; an optical system, through which light radiated to the reticle is projected; a wafer stage for mounting a wafer onto which a pattern of the reticle projected through the optical system is imaged; a detection sensor installed at the wafer stage to detect the alignment marks projected through the optical system; and an alignment part for discriminating an alignment state of the alignment mark detected by the detection sensor to align the wafer stage, whereby it is possible to detect positions of the alignment marks symmetrical about the same axis without alignment error when each alignment mark is detected.

In addition, the detection sensor may use a transmission image sensor.

When the transmission image sensor is used, preferably, the detection sensor includes an X-axis transmission part having a plurality of segments formed in the X-axis direction to selectively transmit light projected through the optical system, and a Y-axis transmission part having a plurality of segments formed in the Y-axis direction, wherein the X- and Y-axis transmission parts are formed corresponding to a mirror image of the X- and Y-axis alignment marks.

In one embodiment, the X-axis alignment mark may include a first X-axis alignment mark located at a first quadrant, a second X-axis alignment mark located at a second quadrant, a third X-axis alignment mark located at a third quadrant, and a fourth X-axis alignment mark located at a fourth quadrant, about center coordinates of the reticle.

In one embodiment, the transmission image sensor may include a first transmission image sensor formed at one side of a surface of the wafer stage to detect mirror images of the first and second X-axis alignment marks, and a second transmission image sensor formed at another side of the surface of the wafer stage to detect mirror images of the third and fourth X-axis alignment marks.

In addition, the Y-axis alignment mark may include a first Y-axis alignment mark located at a first quadrant, a second Y-axis alignment mark located at a second quadrant, a third Y-axis alignment mark located at a third quadrant, and a fourth Y-axis alignment mark located at a fourth quadrant, about center coordinates of the reticle.

In one embodiment, the transmission image sensor may include a first transmission image sensor formed at one side of a surface of the wafer stage to detect mirror images of the first and second Y-axis alignment marks, and a second transmission image sensor formed at another side of the surface of the wafer stage to detect mirror images of the third and fourth Y-axis alignment marks.

The foregoing and other objects, features and advantages of the invention will be apparent from the more particular description of a preferred embodiment of the invention, as illustrated in the accompanying drawing. The drawings are not necessarily to scale, emphasis instead being placed upon illustrating the principles of the invention.

DETAILED DESCRIPTION OF THE INVENTION

The present invention will now be described more fully with reference to the accompanying drawings, in which exemplary embodiments of the invention are shown.

Figure 3A:
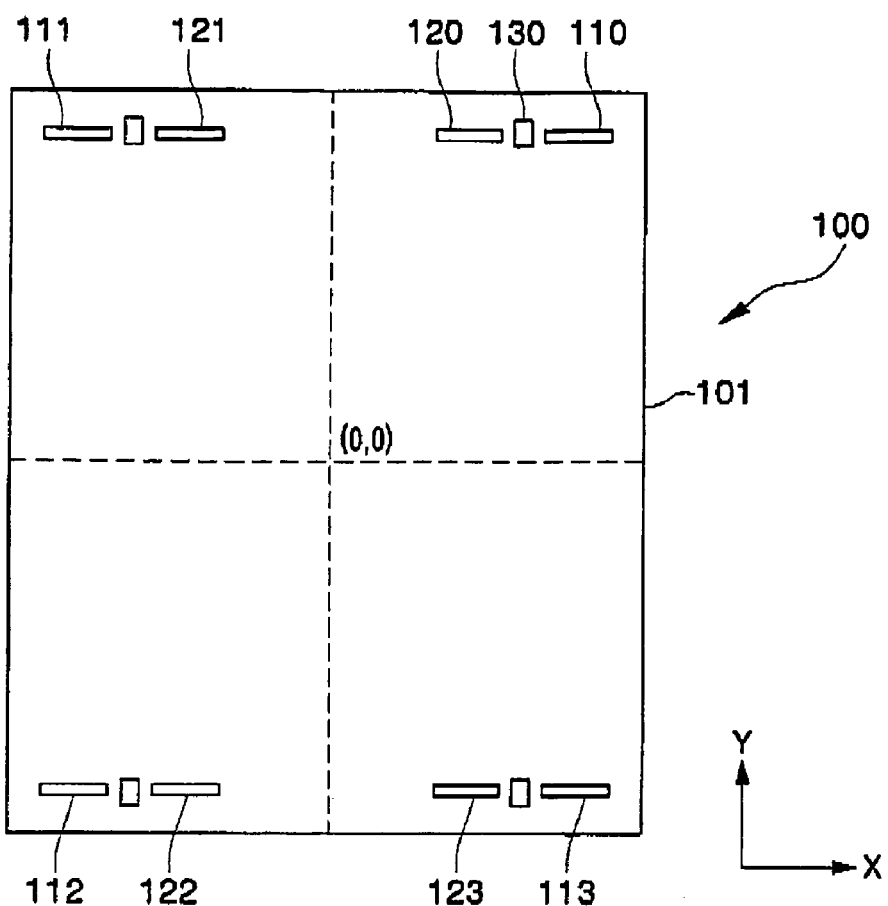
FIG. 3A is a plan view of a reticle in accordance with the present invention.
Figure 3B:
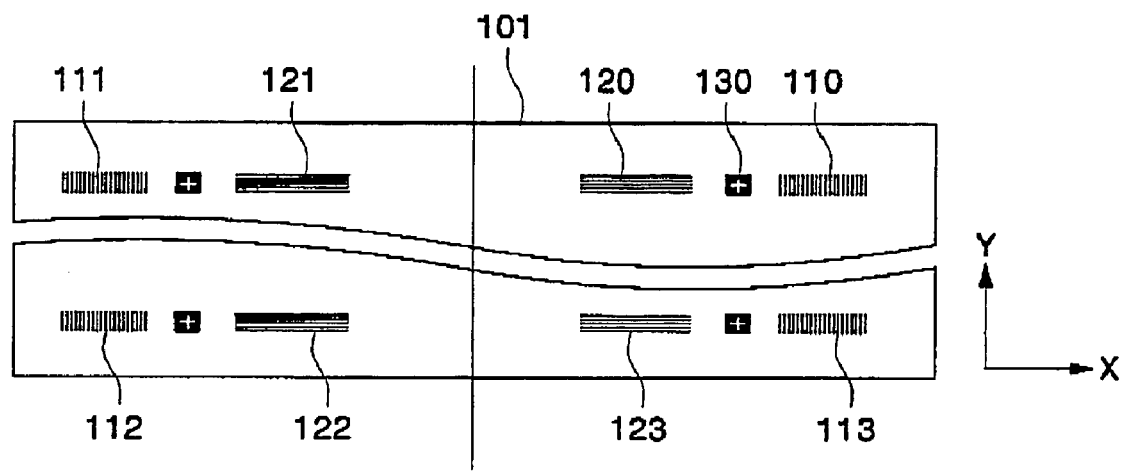
FIG. 3B is an enlarged view of an alignment mark forming part of FIG. 3A.

As shown in FIGS. 3A and 3B, a reticle 100 in accordance with the present invention is made of a rectangular substrate 101 formed of a transparent quartz material. The substrate 101 has a certain circuit pattern designed to be transferred to a wafer in a subsequent lithography transfer step. In addition, the substrate 101 has a plurality of alignment marks formed at its four corners.

The alignment marks for aligning the reticle 100 include X-axis alignment marks 110, 111, 112 and 113, Y-axis alignment marks 120, 121, 122 and 123, and reference marks 130 formed between the X-axis alignment marks 110, 111, 112 and 113 and the Y-axis alignment marks 120, 121, 122 and 123.

Figure 1A:
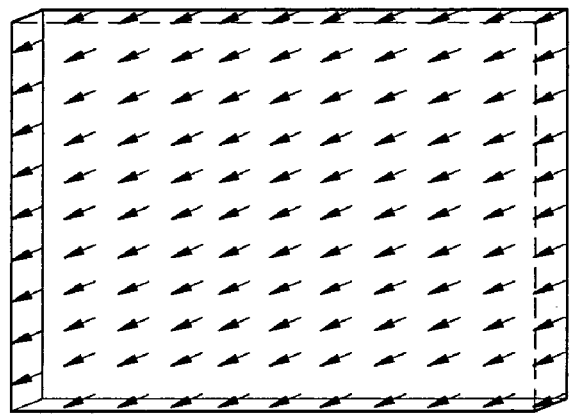
FIGS. 1A to 1D are views illustrating various kinds of conventional overlay error phenomena.
Figure 1B:
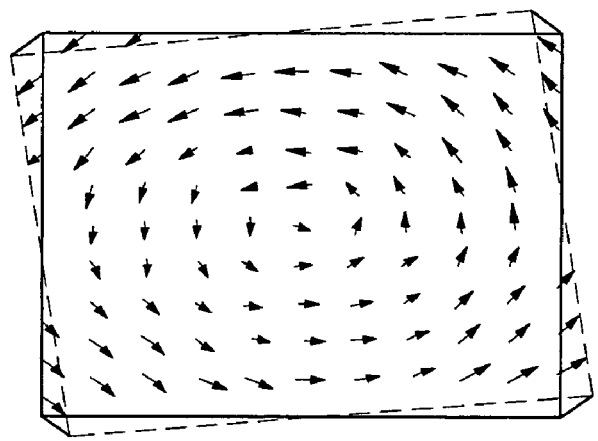
Figure 1C:
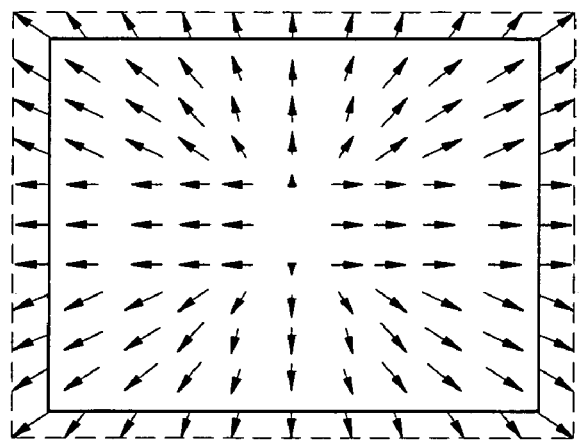
Figure 1D:
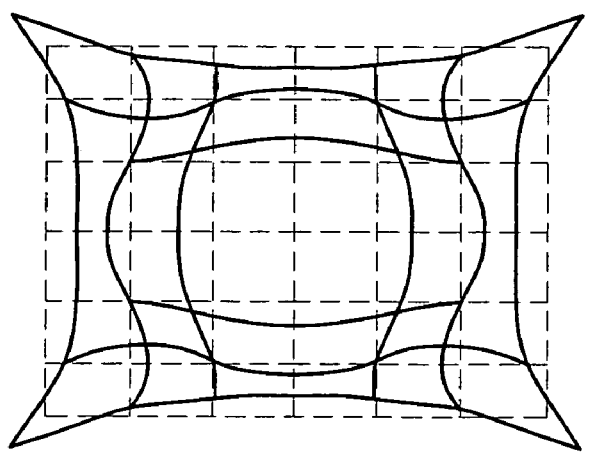
Figure 2A:
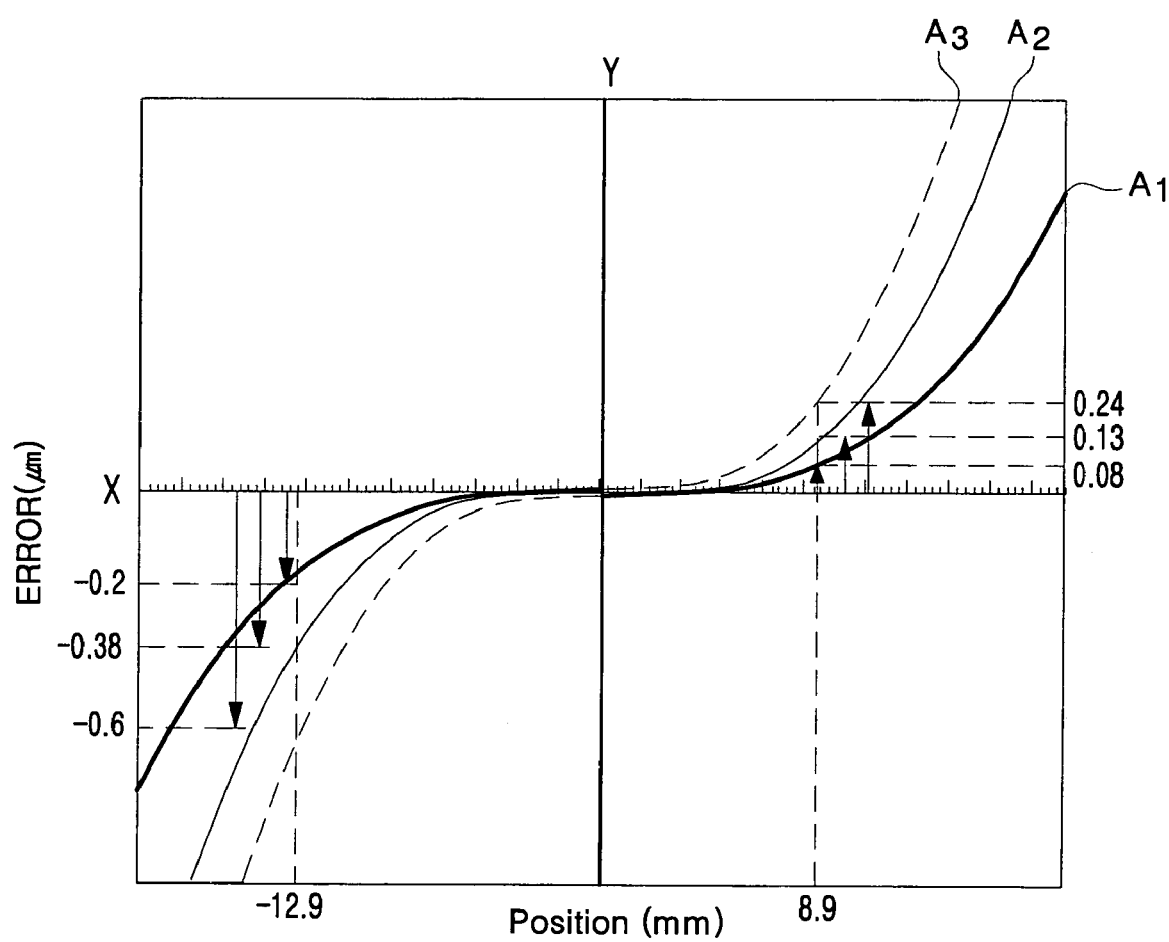
FIG. 2A is an X-Y axis graph representing change in an overlay error due to a third order distortion state of the overlay error phenomena.
Figure 2B:
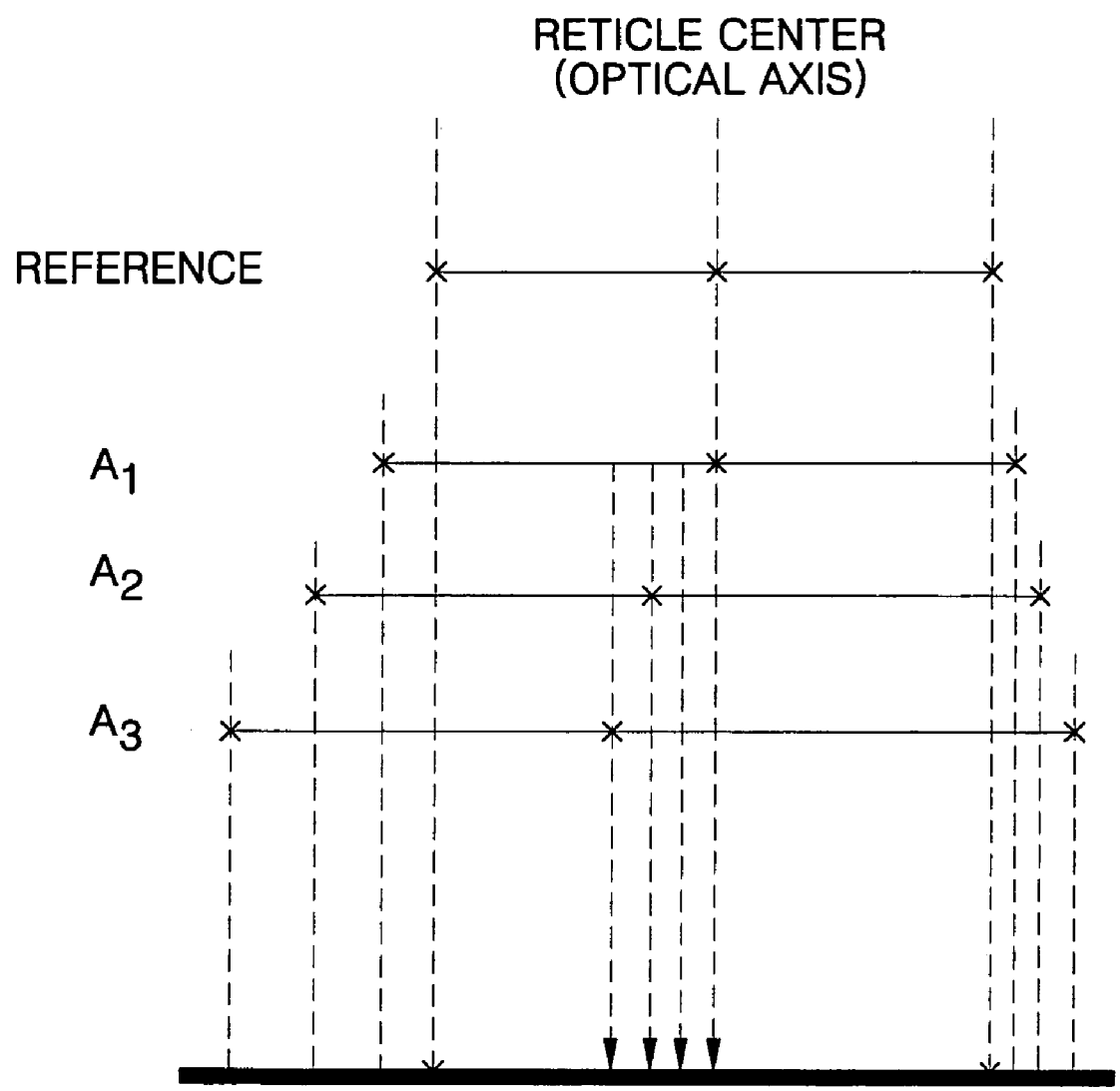
FIG. 2B is a schematic view of an alignment error state generated depending on FIG. 2A.

Here, the X and Y-axes are defined with reference to the plane of FIG. 2. Therefore, the X and Y-axes may be referred to as opposite or orthogonal axes depending on the viewing direction, for more clearly understanding the present invention.

The X-axis alignment marks 110, 111, 112 and 113 have a plurality of segments spaced along the X-axis direction. Each segment is formed to have, for example, a thickness of about 1 μm and a gap of about 12 μm. Several to tens of segments are formed to run parallel to the Y-axis direction.

In addition, the Y-axis alignment marks 120, 121, 122 and 123 also have a plurality of segments spaced along the Y-axis direction. Each segment is formed to have, for example, a thickness of about 1 μm and a gap of about 12 μm. Several to tens of segments are formed to run parallel to the X-axis direction. Moreover, the Y-axis alignment marks 120, 121, 122 and 123 are spaced from respective X-axis alignment marks 110, 111, 112 and 113 with the reference marks 130 interposed therebetween as shown in FIG. 3B.

The reference marks 130 preferably have a rectangular shape and include an "X" or "+" shaped transmission part at a center thereof to be used as a reference position on alignment of the reticle 100. The reference marks are located at a center position between the X-axis alignment marks 110, 111, 112 and 113 and the Y-axis alignment marks 120, 121, 122 and 123. In addition, the reference marks 130 are located at the same distance from a center (or "optical axis" represented by point (0,0) in FIG. 3A) of the reticle 100.

The X-axis alignment marks include a first X-axis alignment mark 110 located at a first quadrant, a second X-axis alignment mark 111 located at a second quadrant, a third X-axis alignment mark 112 located at a third quadrant and a fourth X-axis alignment mark 113 located at a fourth quadrant, on a coordinate plane of the substrate.

In addition, the Y-axis alignment marks include a first Y-axis alignment mark 120 located at a first quadrant, a second Y-axis alignment mark 121 located at a second quadrant, a third Y-axis alignment mark 122 located at a third quadrant and a fourth Y-axis alignment mark 123 located at a fourth quadrant, on a coordinate plane of the substrate.

The X-axis alignment marks 110, 111, 112 and 113 and the Y-axis alignment marks 120, 121, 122 and 123 can be represented as coordinates. For instance, the first X-axis alignment mark 110 and the first Y-axis alignment mark 120 are represented as (X1, Y1), the second X-axis alignment mark 111 and the second Y-axis alignment mark 121 are represented as (X2, Y2), the third X-axis alignment mark 112 and the third Y-axis alignment mark 122 are represented as (X3, Y3), and the fourth X-axis alignment mark 113 and the fourth Y-axis alignment mark 123 are represented as (X4, Y4), where because of symmetrical arrangement of the reference marks about the center (0,0) of the reticle 100, X1=−X2, X3=−X4, Y1=−Y4, and Y2=−Y3.

In addition, segments of the first X-axis alignment mark 110 located at a first quadrant and segments of the second X-axis alignment mark 111 located at a second quadrant are mirror images of each other about the Y-axis, and segments of the third X-axis alignment mark 112 located at a third quadrant and segments of the fourth X-axis alignment mark 113 located at a fourth quadrant are mirror images of each other about the Y-axis.

In addition, segments of the first Y-axis alignment mark 120 located at a first quadrant and segments of the fourth Y-axis alignment mark 123 located at a fourth quadrant are mirror images of each other about the X-axis, and segments of the second Y-axis alignment mark 121 located at a second quadrant and segments of the third X-axis alignment mark 122 located at a third quadrant are mirror images of each other about the X-axis.

Figure 4:
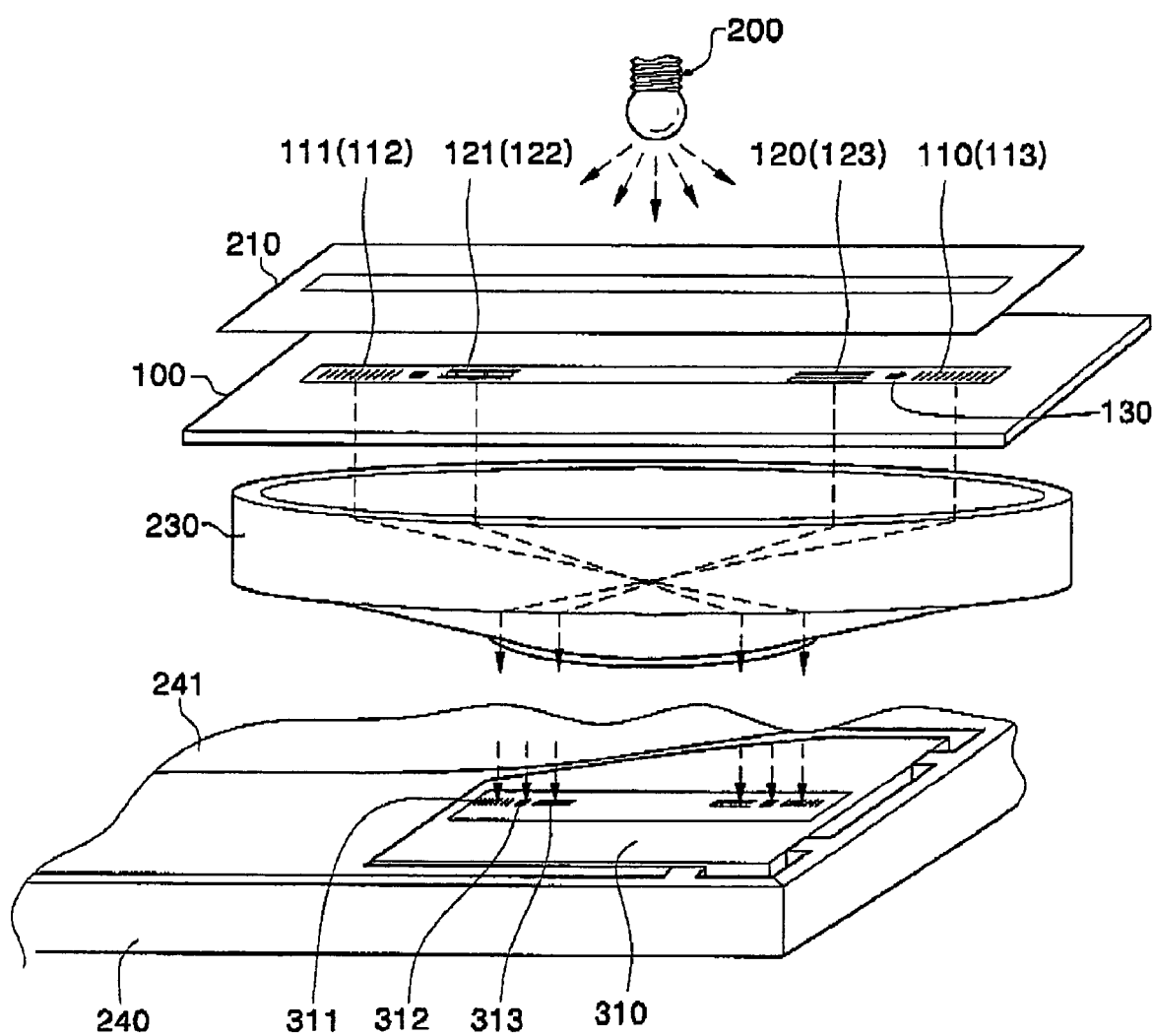
FIG. 4 is an exploded perspective view illustrating an exposure apparatus in accordance with the present invention.

An exposure apparatus using a reticle in accordance with the present invention will now be described with reference to FIG. 4. The exposure apparatus, as preferably used within a scanner, may include a light source 200, a reticle 100, a reticle stage (not shown), an optical part 230, a wafer stage 240, a detection sensor installed at the wafer stage 240, and an alignment part (not shown).

The light source 200 uses an excimer laser. The excimer laser may be a KrF or ArF excimer laser. The ArF excimer laser is preferred as providing a shorter wavelength. It is also contemplated that other kinds of light sources 200 having a short wavelength may be employed, since the expected advantage of the present invention becomes larger with increasing current and shorter wavelength.

In addition, a reticle blind 210 for selecting a region of light radiated to the reticle 100 is installed between the light source 200 and the reticle 100. While not shown, an illuminance regulation lens, a relay lens, a filter, and so on are additionally installed between the light source 200 and the reticle 100. In addition, the reticle stage (not shown) includes an alignment part employing a drive apparatus that is linearly movable in the X- and Y-directions.

The optical system 230 (or "projection optical system") is a reduction optical system made of a plurality of lenses having the same axis, i.e., an optical axis in a Z-direction, forming a reduced projection array. That is, when light is radiated from the light source 200, the pattern of the reticle 100 is reduced by the optical system 230 and incident on a photosensitive surface of the wafer to form a reduced circuit image thereon.

The wafer stage 240 includes a wafer mounting region 241 for mounting the wafer onto which the pattern of the reticle 100 projected through the optical system 230 is imaged, and detection sensors 310 and 320 (FIG. 5A) installed at the exterior of the wafer mounting region 241 to detect the alignment marks of the reticle 100 projected through the optical system 230.

Figure 5A:
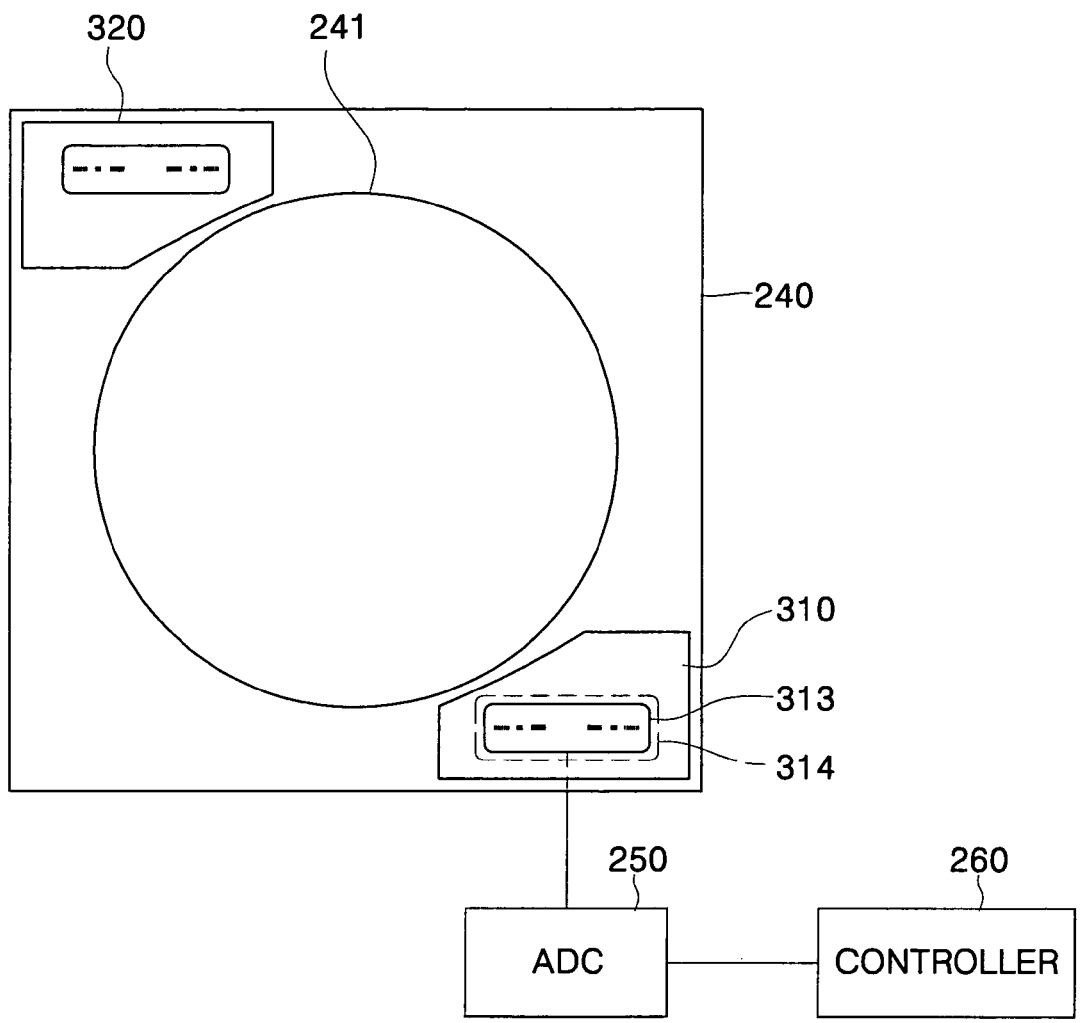
FIG. 5A is a plan view illustrating a wafer stage installed in an exposure apparatus in accordance with the present invention.

As shown in FIG. 5A, the detection sensors include a first transmission image sensor 310 formed at one side of a surface of the wafer stage 240, and a second transmission image sensor 320 installed at a position diagonally relative to the first transmission image sensor 310.

Figure 5B:
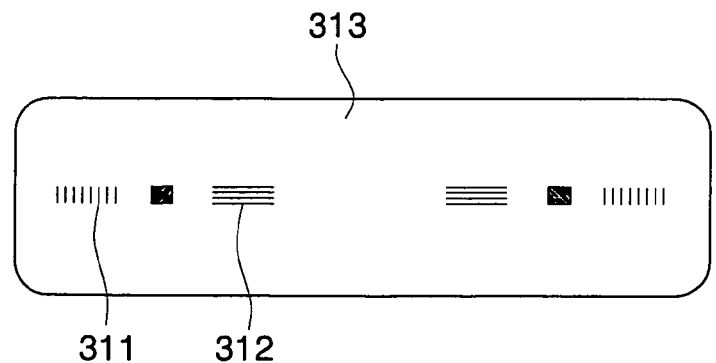
FIG. 5B is an enlarged view of a transmission part of a transmission image sensor of FIG. 5A.

The respective transmission image sensors 310 and 320 are inserted into a surface of an installation region of the wafer stage 240. The transmission image sensors 310 and 320 include a reflection surface 313 having transmission parts 311 and 312 (FIG. 5B) for transmitting the alignment marks of the reticle 100, and an optical detector 314 is installed under the reflection surface 313.

CCD or CMOS devices may be employed in the optical detector 314. In addition, the exposure apparatus includes an analog-to-digital converter 250 for converting analog signals detected by the optical detector 314 into digital signals, and a controller 260 for processing data passing through the converter 250 to produce a measurement value.

Meanwhile, the transmission parts 311 and 312 formed at the reflection surface 313 of the transmission image sensor 310 and 320 include an X-axis transmission part 311 having a plurality of segments spaced apart in an X-axis direction, and a Y-axis transmission part 312 having a plurality of segments spaced apart in a Y-axis direction, for selectively transmitting the light projected through the optical system 230.

In addition, the X- and Y-axis transmission parts 311 and 312 are formed of the X-axis alignment marks 110, 111, 112 and 113 and the Y-axis alignment marks 120, 121, 122 and 123 of the reticle 100 arranged in a mirror image. Therefore, the first transmission image sensor 310 detects the mirror image of the first X-axis alignment mark 110 and the second X-axis alignment mark 111, and the mirror image of the first Y-axis alignment mark 120 and the second Y-axis alignment mark 121.

In addition, the second transmission image sensor 320 detects the mirror image of the third X-axis alignment mark 112 and the fourth X-axis alignment mark 113, and the mirror image of the third Y-axis alignment mark 122 and the fourth Y-axis alignment mark 123. Therefore, the transmission image sensors 310 and 320 are used for determining image positions on X- and Y-axes of the alignment marks on the reticle 100.

Further, while not shown, the wafer stage 240 includes the alignment part for employing a drive apparatus that is linearly movable in the X- and Y-directions to enable alignment of the wafer.

Hereinafter, a reticle 100 and a method of measuring a reticle alignment state of an exposure apparatus using the reticle 100 will be described.

The exposure apparatus in accordance with the present invention measures an alignment state of the reticle before performing an exposure process. The measurement of the alignment state is performed by projecting light from the light source 200 to the detection sensors 310 and 320 of the wafer stage 240 via the reticle 100. After measuring the alignment state, the wafer stage 240, the reticle stage (not shown) and the optical system 230 are adjusted to align the wafer and the reticle, and then a photosensitive layer of the wafer is exposed to a pattern of the reticle.

Figure 7:
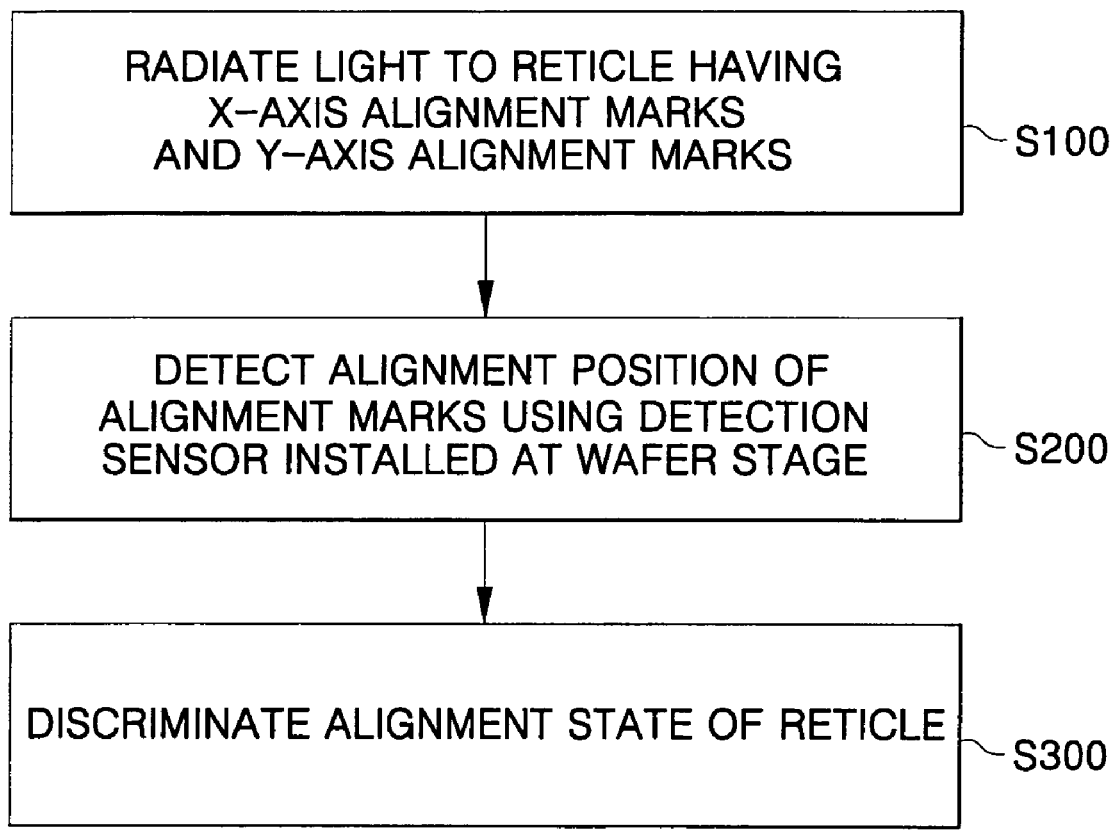
FIG. 7 is a block diagram representing a method of measuring a reticle alignment state using a reticle and an exposure apparatus in accordance with the present invention.

Meanwhile, as shown in FIG. 7, light from the light source 200 is radiated to an alignment mark of the reticle 100 to be projected to transmission image sensors 310 and 320 via the optical system 230 (S100).

Here, first and second X-axis alignment marks 110 and 111 and first and second Y-axis alignment marks 120 and 121 formed at first and second quadrants are projected to the first transmission image sensor 310, and third and fourth X-axis alignment marks 112 and 113 and third and fourth Y-axis alignment marks 122 and 123 formed at third and fourth quadrants are projected to the second transmission image sensor 320. The projection position is adjusted by the wafer stage 240 or the reticle stage, and the alignment is also adjusted by the wafer stage 240 or the reticle stage.

Then, the first transmission image sensor 310 detects alignment positions of the first and second X-axis alignment marks 110 and 111 and the first and second Y-axis alignment marks 120 and 121. And, the second transmission image sensor 320 detects alignment positions of the third and fourth X-axis alignment marks 112 and 113 and the third and fourth Y-axis alignment marks 122 and 123 (S200).

That is, the transmission image sensors 310 and 320 detect the alignment state of the reticle 100 by projecting the mirror image of each of the alignment marks formed on the reticle 100 at each detection region of the transmission parts 311 and 312. The light passes through bright and dark regions of each segment image by the segments symmetrical to the alignment mark to vary output of an optical detector 314. When an analog-to-digital converter 250 converts analog signals generated at this time into digital signals and transmits the digital signals to a controller 260, the controller 260 processes the received signals to precisely detect an alignment state of the alignment marks (S300).

Figure 6A:
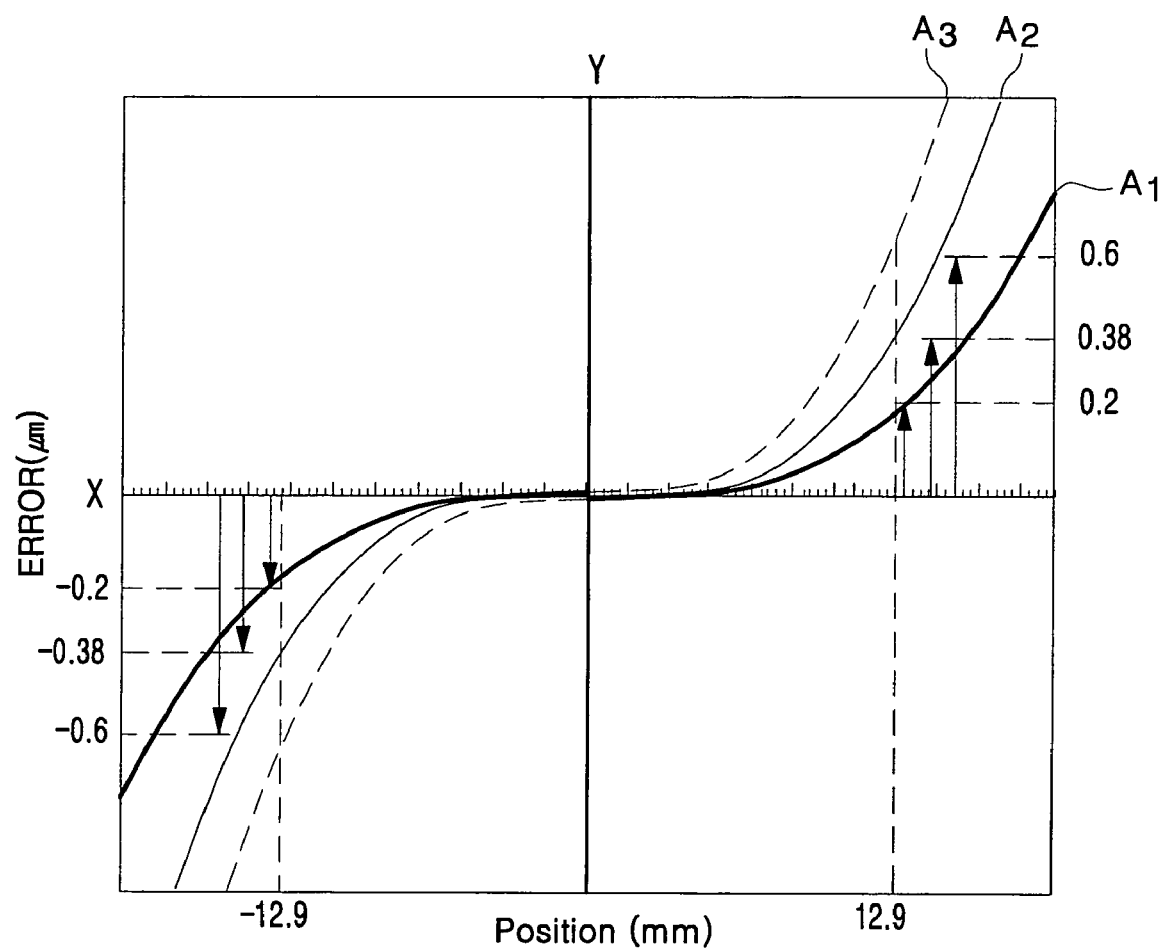
FIG. 6A is an X-Y axis graph representing change in an overlay error due to a third order distortion state of the overlay error phenomena in accordance with the present invention.
Figure 6B:
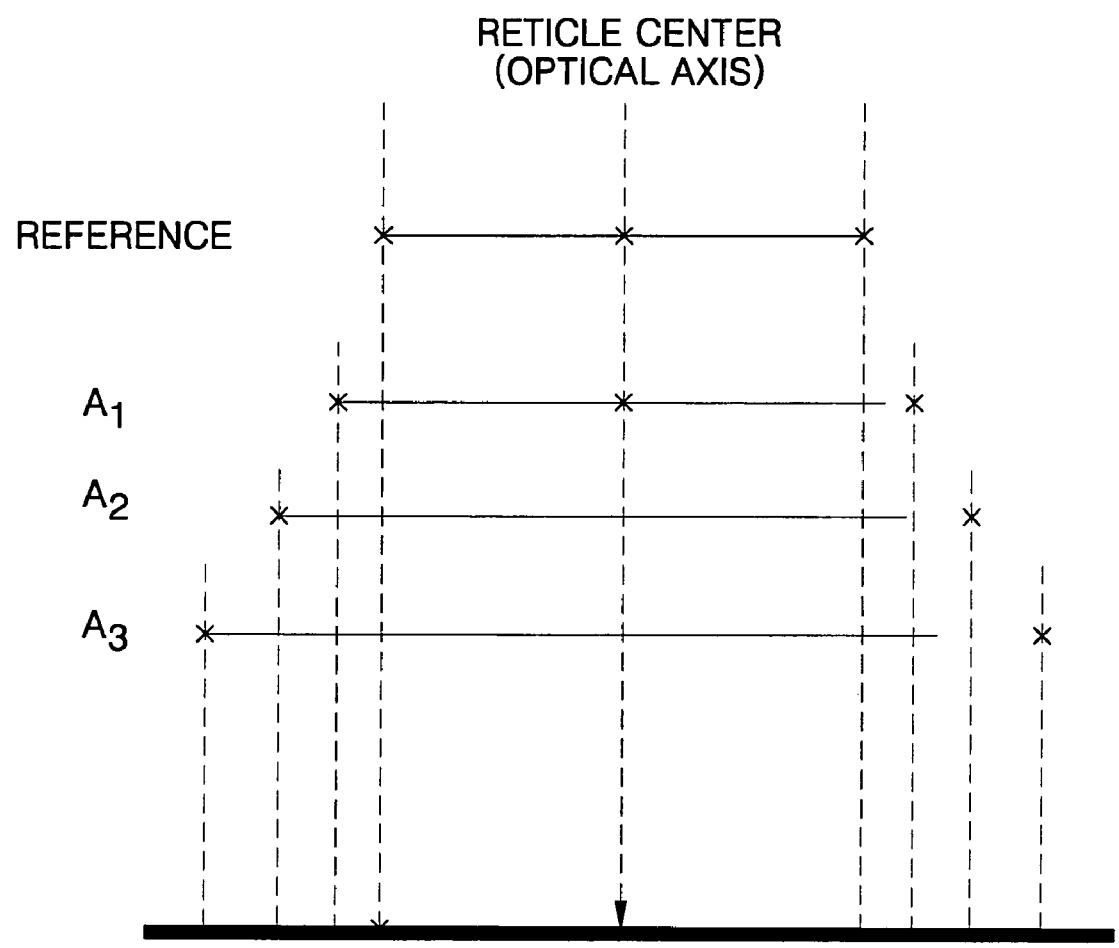
FIG. 6B is a schematic view of an alignment error state generated depending on FIG. 6A.

An example of the reticle 100 and a method of measuring an alignment state of an exposure apparatus using the reticle 100 will now be described. FIGS. 6A and 6B illustrate when a constant of third order distortion in Formulae 1 becomes larger ($A_1 < A_2 < A_3$). However, it can be seen that an error value in the X-axis direction remains the same even when the constant of the third order distortion becomes larger.

That is, when an X coordinate formed at a right side of an optical axis on the wafer is 12.9 mm, and an X coordinate formed at a left side of an optical axis on the wafer is −12.9 mm, error values of the left alignment mark are about −0.2 μm in the case of constant $A_1$ of the third order distortion, about −0.38 μm in the case of constant $A_2$ of the third order distortion, and about −0.6 μm in the case of constant $A_3$ of the third order distortion; and error values of the right alignment mark are also about −0.2 μm in the case of constant $A_1$ of the third order distortion, about −0.38 μm in the case of constant $A_2$ of the third order distortion, and about −0.6 μm in the case of constant $A_3$ of the third order distortion.

Eventually, as shown in FIG. 6B, it is appreciated that the errors of the alignment states of a center (or "optical axis") of the reticle 100 increase equally along both sides of the X-axis. That is, and unlike in the situation with conventional alignment shown in FIG. 2B, the alignment error is symmetric about the optical axis of the reticle 100. Therefore, in the case of the same magnitude of alignment errors, i.e., when no offset drift of the third order distortion is generated, since a current alignment state can be more precisely recognized, it is possible to precisely align the reticle.

Accordingly, while unexpected aberration is generated by heating a lens during use of the exposure apparatus, the alignment errors generated at both sides of the X and Y coordinate axes by the aberration are equal, thus enabling easier alignment. As a result, since an overlay alignment is improved by about 10 nm, in the case of manufacturing a 300 mm wafer, manufacturing efficiency can be noticeably improved.

As can be seen from the foregoing, a reticle and an exposure apparatus using the reticle in accordance with the present invention include alignment marks having a plurality of segments along each coordinate direction corresponding to a plurality of regions of the reticle in a symmetrical arrangement about each coordinate axis. The apparatus further includes detection sensors having detection regions corresponding to the mirror image of the alignment marks of the reticle, whereby it is possible to prevent alignment errors generated due to aberration of a lens from being different on either side of each coordinate axis. As a result, users will be able to obtain more precise reticle alignment and therefore overlay alignment, and effective measurement and adjustment of the alignment in spite of unexpected aberration generated due to heating of the lens by the high intensity light source used.

While this invention has been described in connection with what is presently considered to be the most practical and preferred embodiment, it is to be understood that the invention is not limited to the disclosed embodiment, but on the contrary, it is intended to cover various modification within the spirit and the scope of the Invention, which is set forth in the appended claims.

What is claimed is:

1. An exposure apparatus comprising:
    a light source;
    a reticle, through which light radiated from the light source is transmitted, having a designed pattern formed thereon and having X-axis alignment marks and Y-axis alignment marks, the X-axis alignment marks having a plurality of segments formed at two or more positions on a substrate symmetrical about and equidistant from a substrate X-axis, the Y-axis alignment marks having a plurality of segments formed at two or more positions of the substrate symmetrical about and equidistant from a substrate Y-axis;
    an optical system, through which light radiated to the reticle is projected;
    a wafer stage for mounting a wafer onto which the designed pattern of the reticle projected through the optical system is imaged;
    a transmission image sensor installed at the wafer stage to detect the alignment marks projected through the optical system, wherein the transmission image sensor comprises an X-axis transmission part having a plurality of segments spaced apart in the X-axis direction to selectively transmit the light projected through the optical system, and a Y-axis transmission part having a plurality of segments spaced apart in the Y-axis direction; and
    an alignment part for discriminating an alignment state of the alignment mark detected by the transmission image sensor to align the wafer stage.

2. The exposure apparatus according to claim 1, wherein the X and respective Y alignment marks are arranged relative to one another parallel to the X-axis.

3. The exposure apparatus according to claim 1, wherein the X- and Y-axis transmission parts are formed corresponding to mirror images of the X- and Y-axis alignment marks.

4. The exposure apparatus according to claim 1, wherein the X-axis alignment marks comprise a first X-axis alignment mark located at a first quadrant of the substrate, a second X-axis alignment mark located at a second quadrant of the substrate, a third X-axis alignment mark located at a third quadrant of the substrate, and a fourth X-axis alignment mark located at a fourth quadrant of the substrate, about center coordinates of the reticle.

5. The exposure apparatus according to claim 4, wherein the transmission image sensor comprises a first transmission image sensor formed at one side of a surface of the wafer stage, and a second transmission image sensor formed at another side of the surface of the wafer stage.

6. The exposure apparatus according to claim 5, wherein the first transmission image sensor detects mirror images of the first and second X-axis alignment marks, and the second transmission image sensor detects mirror images of the third and fourth X-axis alignment marks.

7. The exposure apparatus according to claim 1, wherein the Y-axis alignment marks comprise a first Y-axis alignment mark located at a first quadrant of the substrate, a second Y-axis alignment mark located at a second quadrant of the substrate, a third Y-axis alignment mark located at a third quadrant of the substrate, and a fourth Y-axis alignment mark located at a fourth quadrant of the substrate, about center coordinates of the reticle.

8. The exposure apparatus according to claim 7, wherein the transmission image sensor comprises a first transmission image sensor formed at one side of a surface of the wafer stage, and a second transmission image sensor formed at another side of the surface of the wafer stage.

9. The exposure apparatus according to claim 7, wherein the first transmission image sensor detects mirror images of the first and second Y-axis alignment marks, and the second transmission image sensor detects mirror images of the third and fourth Y-axis alignment marks.

10. A method of measuring a reticle alignment state, comprising:
    radiating light from a light source to a reticle having X-axis alignment marks that include a plurality of segments formed symmetrical about and equidistant from an X-axis, and Y-axis alignment marks that include a plurality of segments formed symmetrical about and equidistant from a Y-axis;
    detecting the radiated light by projecting the radiated light through an optical system using a transmission image sensor installed at a wafer stage, wherein the transmission image sensor comprises an X-axis transmission part having a plurality of segments formed in the X-axis direction to selectively transmit the light projected through the optical system; and a Y-axis transmission part having a plurality of segments formed in the Y-axis direction; and
    discriminating an alignment state of the reticle by measuring detected alignment signals of the alignment mark at a controller.

11. The method according to claim 10, wherein the X- and Y-axis transmission parts are formed corresponding to mirror images of the X- and Y-axis alignment marks.

* * * * *